United States Patent
Zhao

(10) Patent No.: US 11,588,126 B2
(45) Date of Patent: Feb. 21, 2023

(54) QLED LIGHT-EMITTING DEVICE AND QLED DISPLAY PANEL HAVING INSULATING LAYER AMONG QUANTUM DOT LAYER

(71) Applicant: TCL CHINA STAR OPTOELECTRONICS TECHNOLOGY CO., LTD., Guangdong (CN)

(72) Inventor: Jinyang Zhao, Guangdong (CN)

(73) Assignee: TCL CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 360 days.

(21) Appl. No.: 16/954,331

(22) PCT Filed: Jun. 5, 2020

(86) PCT No.: PCT/CN2020/094503
§ 371 (c)(1),
(2) Date: Jun. 16, 2020

(87) PCT Pub. No.: WO2021/212619
PCT Pub. Date: Oct. 28, 2021

(65) Prior Publication Data
US 2022/0310952 A1  Sep. 29, 2022

(30) Foreign Application Priority Data
Apr. 22, 2020 (CN) .......... 202010323410.5

(51) Int. Cl.
*H01L 51/50* (2006.01)

(52) U.S. Cl.
CPC ........ *H01L 51/502* (2013.01); *H01L 51/5044* (2013.01)

(58) Field of Classification Search
CPC combination set(s) only.
See application file for complete search history.

(56) References Cited

U.S. PATENT DOCUMENTS 7,795,609 B2 * 9/2010 Huffaker ................ B82Y 20/00
257/17
8,089,080 B2 * 1/2012 Calder ................... H05B 33/22
257/E33.012
(Continued)

FOREIGN PATENT DOCUMENTS

CN   101055923 A   10/2007
CN   105261707 A   1/2016
(Continued)

*Primary Examiner* — Nduka E Ojeh
(74) *Attorney, Agent, or Firm* — PV IP PC; Wei Te Chung; Ude Lu

(57) ABSTRACT

A QLED light-emitting device is provided, including a first electrode layer, an electron injection layer, an electron transport layer, a light-emitting layer, a hole transport layer, a hole injection layer, and a second electrode layer. Wherein, the light-emitting layer includes a plurality of quantum dot layers disposed in a stack, and insulating layers are disposed among the quantum dot layers adjacent to one side of the electron injection layer. Through disposing the insulating layers among the quantum dot layers adjacent to the one side of the electron injection layer, an electron transmission rate is reduced, thereby balancing the electron transmission rate and a hole transmission rate and improving luminous efficiency of QLEDs.

16 Claims, 4 Drawing Sheets

(56) References Cited

U.S. PATENT DOCUMENTS

2018/0054872 A1* 2/2018 Xu ..................... H01L 51/0037
2019/0157571 A1   5/2019 Umeda et al.
2020/0313108 A1* 10/2020 Jang ................... H01L 51/5088

FOREIGN PATENT DOCUMENTS

| CN | 105552244 A | 5/2016 |
| CN | 106374051 A | 2/2017 |
| CN | 107910449 A | 4/2018 |
| CN | 110212105 A | 9/2019 |

* cited by examiner

QLED LIGHT-EMITTING DEVICE AND QLED DISPLAY PANEL HAVING INSULATING LAYER AMONG QUANTUM DOT LAYER

FIELD OF INVENTION

The present disclosure relates to the field of QLED display technologies, and more particularly, to a QLED light-emitting device and a QLED display panel.

BACKGROUND OF INVENTION

In current quantum dot light-emitting diode (QLED) light-emitting devices, a light-emitting layer consists of a plurality of quantum dot layers. Since a hole transmission rate is less than an electron transmission rate, electrons will accumulate in the quantum dot layers and emit quenching excitons. A problem of electron accumulations in a light-emitting functional layer of the current QLED light-emitting devices requires to be solved. Therefore, the current QLED light-emitting devices have a technical problem of unbalanced transmission of electrons and holes.

SUMMARY OF INVENTION

An embodiment of the present disclosure provides a QLED light-emitting device and a QLED display panel to relieve the technical problem of unbalanced transmission of electrons and holes existing in current QLED light-emitting devices.

An embodiment of the present disclosure provides a QLED light-emitting device, which includes a first electrode layer, an electron injection layer, an electron transport layer, a light-emitting layer, a hole transport layer, a hole injection layer, and a second electrode layer; the light-emitting layer comprises a plurality of quantum dot layers disposed in a stack, and insulating layers are disposed among the quantum dot layers adjacent to one side of the electron injection layer.

In the QLED light-emitting device provided by an embodiment of the present disclosure, the insulating layers are disposed between every two adjacent quantum dot layers within the light-emitting layer.

In the QLED light-emitting device provided by an embodiment of the present disclosure, thicknesses of the insulating layers adjacent to the one side of the electron injection layer are greater than thicknesses of the insulating layers adjacent to one side of the hole injection layer.

In the QLED light-emitting device provided by an embodiment of the present disclosure, from one side adjacent to the electron injection layer to one side adjacent to the hole injection layer, the thicknesses of the insulating layers are reduced in sequence.

In the QLED light-emitting device provided by an embodiment of the present disclosure, a preparation material of the insulating layers is a polymethyl methacrylate material.

In the QLED light-emitting device provided by an embodiment of the present disclosure, the thicknesses of the insulating layers range from 3 nm to 8 nm.

In the QLED light-emitting device provided by an embodiment of the present disclosure, the thicknesses of the insulating layers adjacent to the one side of the electron injection layer range from 6 nm to 8 nm.

In the QLED light-emitting device provided by an embodiment of the present disclosure, the thicknesses of the insulating layers adjacent to the one side of the hole injection layer range from 3 nm to 5 nm.

In the QLED light-emitting device provided by an embodiment of the present disclosure, adjacent to the one side of the electron injection layer, the thicknesses of the insulating layers are equal to each other, and adjacent to the one side of the hole injection layer, there are no insulating layers disposed between two adjacent quantum dot layers.

In the QLED light-emitting device provided by an embodiment of the present disclosure, adjacent to the one side of the electron injection layer, at least two of the insulating layers are disposed between two adjacent quantum dot layers.

In the QLED light-emitting device provided by an embodiment of the present disclosure, the insulating layers are disposed among adjacent quantum dot layers by coating an entire layer of the quantum dot layers.

In the QLED light-emitting device provided by an embodiment of the present disclosure, a plurality of patterned arrays of the insulating layers formed by patterning are disposed between the adjacent quantum dot layers.

In the QLED light-emitting device provided by an embodiment of the present disclosure, the thicknesses of the insulating layers are reduced in an arithmetic sequence.

In the QLED light-emitting device provided by an embodiment of the present disclosure, the thicknesses of the insulating layers are reduced in a geometric sequence.

An embodiment of the present disclosure provides a QLED display panel, which includes a substrate, an array layer, a pixel definition layer, a QLED light-emitting device, and an encapsulation layer; wherein the QLED light-emitting device includes a first electrode layer, an electron injection layer, an electron transport layer, a light-emitting layer, a hole transport layer, a hole injection layer, and a second electrode layer; and the light-emitting layer comprises a plurality of quantum dot layers disposed in a stack, and insulating layers are disposed among the quantum dot layers adjacent to one side of the electron injection layer.

In the QLED display panel provided by an embodiment of the present disclosure, a preparation material of the insulating layers is a polymethyl methacrylate material.

In the QLED display panel provided by an embodiment of the present disclosure, thicknesses of the insulating layers range from 3 nm to 8 nm, wherein, the thicknesses of the insulating layers adjacent to the one side of the electron injection layer range from 6 nm to 8 nm, and the thicknesses of the insulating layers adjacent to one side of the hole injection layer range from 3 nm to 5 nm.

In the QLED display panel provided by an embodiment of the present disclosure, the insulating layers are disposed between every two adjacent quantum dot layers within the light-emitting layer.

In the QLED display panel provided by an embodiment of the present disclosure, thicknesses of the insulating layers adjacent to the one side of the electron injection layer are greater than thicknesses of the insulating layers adjacent to the one side of the hole injection layer.

In the QLED display panel provided by an embodiment of the present disclosure, from one side adjacent to the electron injection layer to one side adjacent to the hole injection layer, the thicknesses of the insulating layers are reduced in sequence.

Beneficial effect: the QLED light-emitting device provided by the embodiments of the present disclosure includes a substrate, an array layer, a pixel definition layer, a light-emitting functional layer, and an encapsulation layer; the light-emitting functional layer includes an electron injection layer, an electron transport layer, a light-emitting layer, a hole transport layer, and a hole injection layer; and the light-emitting layer includes a plurality of quantum dot layers disposed in a stack, and insulating layers are disposed among the quantum dot layers adjacent to one side of the electron injection layer. Wherein, through disposing the insulating layers on one side of the quantum dot layers adjacent to the electron injection layer, electron transmission can be blocked, which reduces an electron transmission rate, and membrane quality of the quantum dot layers can be improved at same time, thereby balancing the electron transmission rate and a hole transmission rate, improving luminous efficiency of QLEDs, and improving the technical problem of unbalanced transmission of electrons and holes existing in current QLED light-emitting devices.

DESCRIPTION OF DRAWINGS

The following detailed description of specific embodiments of the present disclosure will make the technical solutions and other beneficial effects of the present disclosure obvious with reference to the accompanying drawings.

DETAILED DESCRIPTION OF PREFERRED EMBODIMENTS

Figure 1:
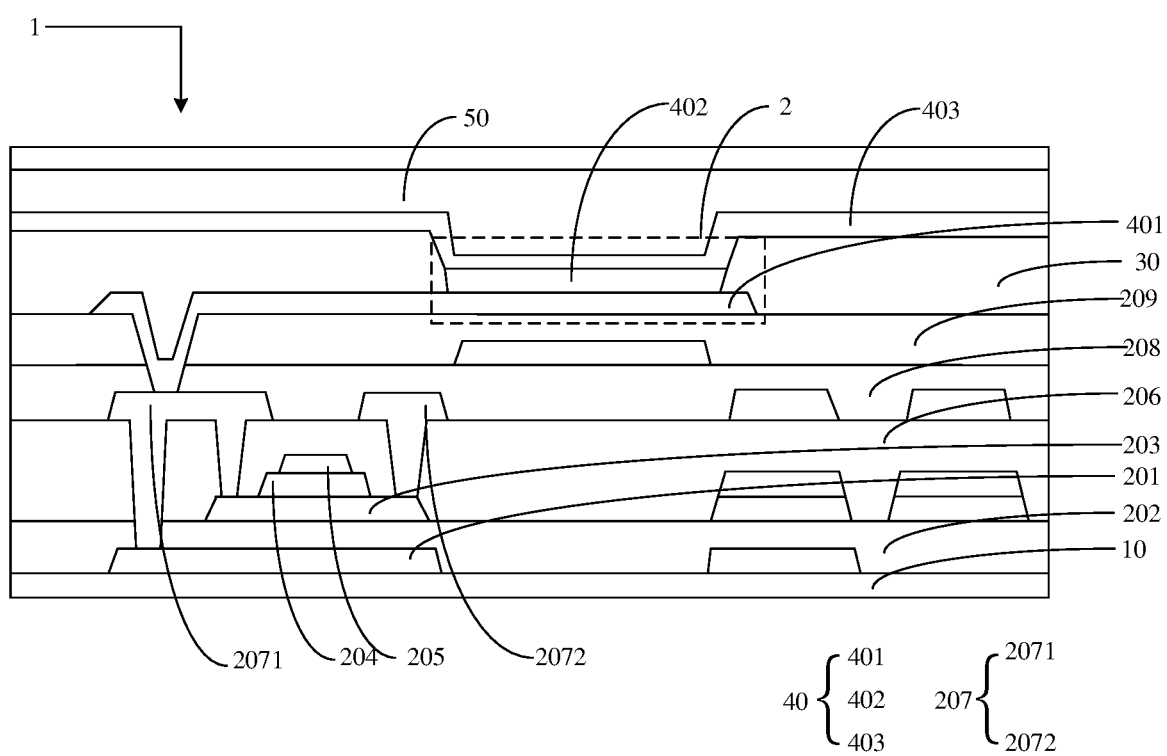
FIG. 1 is a schematic cross-sectional diagram of a QLED light-emitting device according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one of these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrated connection; it can mean a mechanical connection, an electrical connection, or can communicate with each other; it can mean a direct connection, an indirect connection by an intermediary, or an inner communication or an inter-reaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The following description provides many different embodiments or examples for implementing different structures of the present disclosure. In order to simplify the present disclosure, the components and settings of a specific example are described below. Of course, they are merely examples and are not intended to limit the present disclosure. In addition, the present disclosure may repeat reference numerals and/or reference letters in different examples, which are for the purpose of simplicity and clarity, and do not indicate the relationship between the various embodiments and/or arrangements discussed. In addition, the present disclosure provides examples of various specific processes and materials, but one of ordinary skill in the art will recognize the use of other processes and/or the use of other materials.

For better description, an embodiment of the present disclosure provides a QLED display panel including a QLED light-emitting device. The details are as follows.

Figure 2:
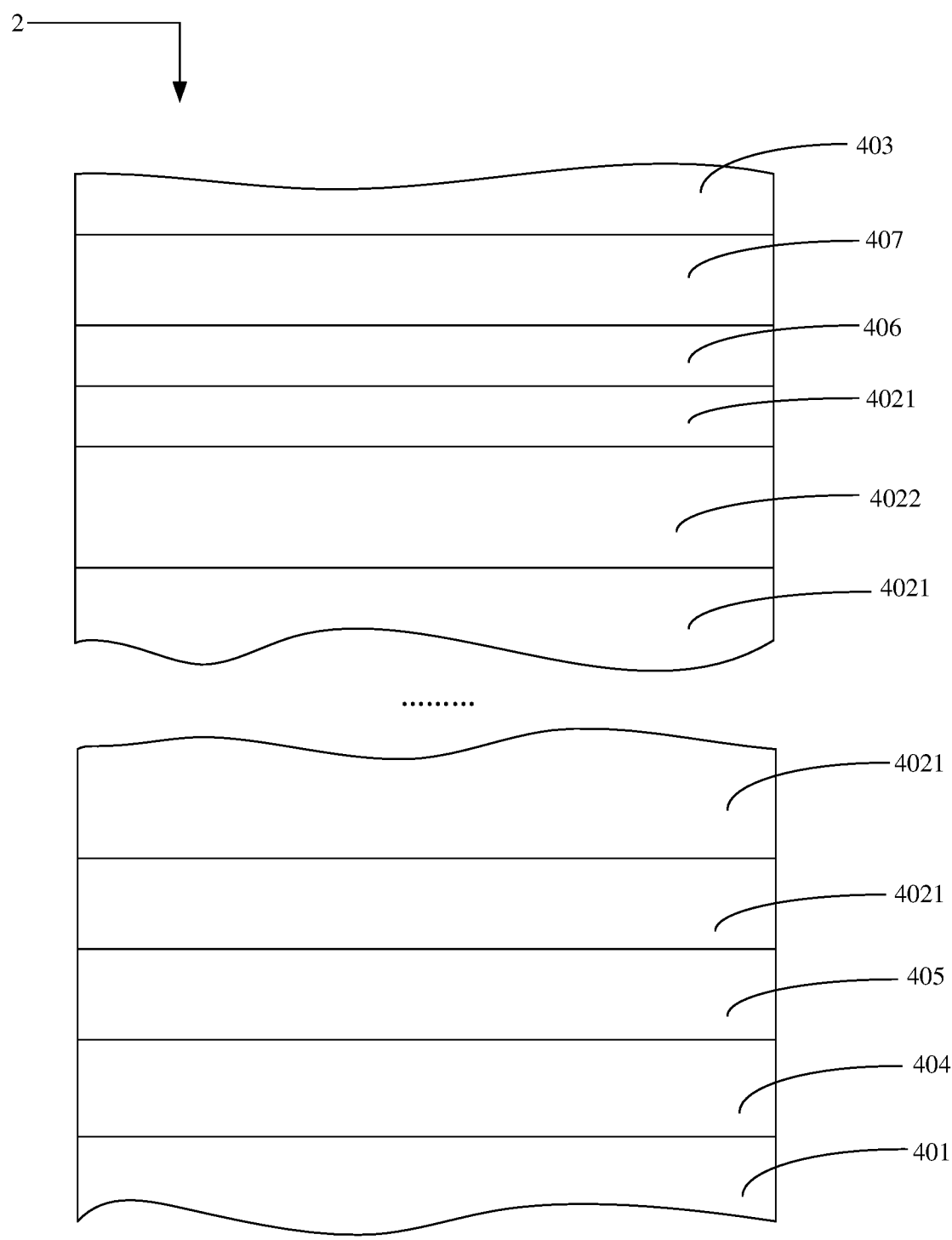
FIG. 2 is a first schematic cross-sectional diagram of a light-emitting functional layer of a QLED light-emitting device according to an embodiment of the present disclosure.

As shown in FIGS. 1 and 2, the QLED display panel 1 provided by the embodiment of the present disclosure includes a substrate 10, an array layer 20, a pixel definition layer 30, a light-emitting functional layer 40, and an encapsulation layer 50. The light-emitting functional layer 40 is disposed on the pixel definition layer 30 and includes an electron injection layer 407, an electron transport layer 406, a light-emitting layer 402, a hole transport layer 405, and a hole injection layer 404. Wherein, the light-emitting layer comprises a plurality of quantum dot layers 4021 disposed in a stack, and adjacent to one side of the electron injection layer 407, an insulating layer 4022 is disposed among the quantum dot layers 4021.

The QLED display panel 1 provided by the embodiment of the present disclosure includes the substrate 10, the array layer 20, the pixel definition layer 30, the light-emitting functional layer 40, and the encapsulation layer 50. The light-emitting functional layer 40 is disposed on the pixel definition layer 30 and includes the electron injection layer 407, the electron transport layer 406, the light-emitting layer 402, the hole transport layer 405, and the hole injection layer 404. Wherein, the light-emitting layer comprises the plurality of quantum dot layers 4021 disposed in a stack, and adjacent to the one side of the electron injection layer 407, the insulating layer 4022 is disposed among the quantum dot layers 4021. Wherein, through disposing the insulating layer 4022 on one side of the quantum dot layers 4021 adjacent to the electron injection layer 407, electron transmission can be blocked, which reduces the electron transmission rate, and membrane quality of the quantum dot layers 4021 can be improved at the same time, thereby improving the technical problem of unbalanced transmission of electrons and holes existing in the current QLED display panel 1.

Wherein, as shown in FIG. 1, the array layer 20 includes a light shielding layer 201, a buffer layer 202, an active layer 203, a gate insulating layer 204, a gate electrode layer 205, an interlayer insulating layer 206, a source/drain electrode layer 207, a passivation layer 208, and a planarization layer 209.

Wherein, as shown in FIG. 1, the light-emitting functional layer 40 includes a first electrode layer 401, the light-emitting layer 402, and a second electrode layer 403.

As shown in FIG. 2, a QLED light-emitting device 2 provided by an embodiment of the present disclosure includes the first electrode layer 401, the electron injection layer 407, the electron transport layer 406, the light-emitting layer 402, the hole transport layer 405, the hole injection layer 404, and the second electrode layer 403. Wherein, the light-emitting layer comprises a plurality of quantum dot layers 4021 disposed in a stack, and adjacent to one side of the electron injection layer 407, an insulating layer 4022 is disposed among the quantum dot layers 4022.

In the embodiment of the present disclosure, the QLED light-emitting device 2 includes the first electrode layer 401, the electron injection layer 407, the electron transport layer 406, the light-emitting layer 402, the hole transport layer 405, the hole injection layer 404, and the second electrode layer 403. Wherein, the light-emitting layer comprises the plurality of quantum dot layers 4021 disposed in a stack, and adjacent to the one side of the electron injection layer 407, the insulating layer 4022 is disposed among the quantum dot layers 4021. Wherein, through disposing the insulating layer 4022 on one side of the quantum dot layers 4021 adjacent to the electron injection layer 407, electron transmission can be blocked, which reduces the electron transmission rate, and the membrane quality of the quantum dot layers 4021 can be improved at the same time, thereby improving the technical problem of unbalanced transmission of electrons and holes existing in the current QLED display panel 1.

Figure 3:
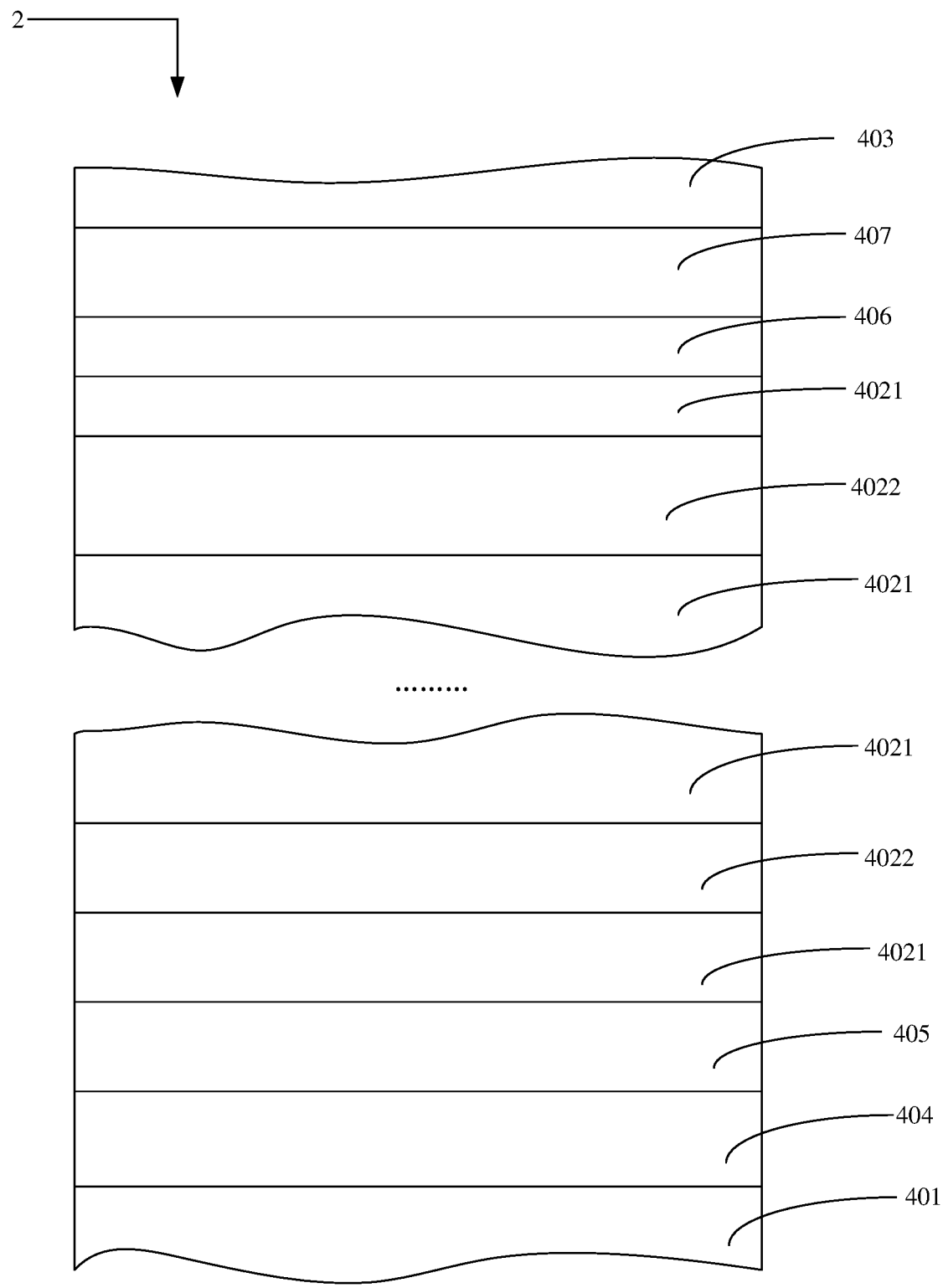
FIG. 3 is a second schematic cross-sectional diagram of a light-emitting functional layer of a QLED light-emitting device according to an embodiment of the present disclosure.

In an embodiment of the present disclosure, as shown in FIG. 3, in the light-emitting layer, insulating layers are disposed between every two adjacent quantum dot layers.

Wherein, one of the insulating layers 4022 may be disposed between every two adjacent quantum dot layers.

Wherein, two of the insulating layers 4022 may be disposed between every two adjacent quantum dot layers.

Wherein, thicknesses of the insulating layers 4022 may be the same or may also be different.

Wherein, the insulating layers 4022 may be disposed by coating an entire layer, or a plurality of insulating layers 4022 formed by patterning may be disposed between adjacent quantum dot layers 4021 in an array.

In the embodiment, the insulating layers 4022 are disposed between all of the adjacent quantum dot layers, which can block electron transmission and meanwhile optimize membrane quality of the quantum dot layers 4021 adjacent to the insulating layers 4022.

Wherein, a preparation material of the insulating layers 4022 may be a polymethyl methacrylate material. Films made of the polymethyl methacrylate material have smooth surfaces, so the membrane quality of the quantum dot layers 4021 can be improved by fabricating the films on the quantum dot layers 4021.

In an embodiment of the present disclosure, as shown in FIG. 3, the thicknesses of the insulating layers 4022 adjacent to one side of the electron injection layer 407 are greater than the thicknesses of the insulating layers 4022 adjacent to one side of the hole injection layer 404.

Wherein, through thickening the insulating layers 4022 on one side of the electron transport layer 406, the thicknesses thereof are greater than the thicknesses of the insulating layers 4022 on one side of the hole transport layer 405, and the thicker insulating layers 4022 can block more electrons, thereby overall reducing the electron transmission rate.

In the embodiment, through thickening the insulating layers 4022 adjacent to one side of the electron transport layer 406 and disposing one of the insulating layers 4022 between every two adjacent quantum dot layers 4021, surfaces of the insulating layers 4022 are flat, thereby improving the membrane quality of the quantum dot layers 4021.

In an embodiment of the present disclosure, the thicknesses of the insulating layers 4022 are reduced in sequence from the one side adjacent to the electron injection layer 407 to the one side adjacent to the hole injection layer 404.

Wherein, the thicknesses are reduced in sequence, and the thicknesses of the plurality of adjacent insulating layers 4022 are reduced in an arithmetic sequence.

Wherein, the thicknesses are reduced in sequence, and the thicknesses of the plurality of adjacent insulating layers 4022 are reduced in a geometric sequence.

In an embodiment of the present disclosure, a preparation material of the insulating layers 4022 is a polymethyl methacrylate material.

Wherein, since a conduction band of the polymethyl methacrylate material has a higher energy level than the quantum dot layers 4021 and the polymethyl methacrylate material has good transparency, acetone can be used for solution processing, and acetone will not destroy the quantum dot layers 4021.

Wherein, thicknesses of the quantum dot layers 4021 range from 30 nm to 100 nm.

Specifically, a combination and a number of the insulating layers 4022 and the quantum dot layers 4021 are determined by a design of a QLED light-emitting device 2 structure. The greater the combination and the number of the insulating layers 4022 and the quantum dot layers 4021 are, the more significantly the electron transmission rate is weakened. In general, a preferred combination is three quantum dot layers 4021 and two insulating layers 4022 with the polymethyl methacrylate material, which can better block electron transmission, thereby balancing the transmission of electrons and holes.

In an embodiment of the present disclosure, the thicknesses of the insulating layers 4022 range from 3 nm to 8 nm.

Wherein, a thickness range of the polymethyl methacrylate material being 3 nm to 8 nm is necessary. A film-forming thickness of the polymethyl methacrylate material greater than 8 nm may result in the quantum dot layers 4021 having open circuits, while a film-forming thickness of the polymethyl methacrylate material less than 3 nm may not have any insulating effect.

In an embodiment of the present disclosure, the thicknesses of the insulating layers 4022 adjacent to the one side of the electron injection layer 407 range from 6 nm to 8 nm.

In the embodiment, compared to the insulating layers 4022 adjacent to the one side of the hole injection layer 404, the insulating layers 4022 disposed adjacent to the one side of the electron injection layer 407 are thicker, which can effectively reduce the electron transmission rate, and meanwhile the thicknesses of the insulating layers 4022 are within the range of 6 nm to 8 nm, which will not result in the quantum dot layers 4021 having open circuits.

In an embodiment of the present disclosure, the thicknesses of the insulating layers 4022 adjacent to the one side of the hole injection layer 404 range from 3 nm to 5 nm.

In the embodiment, compared to the insulating layers 4022 adjacent to the one side of the electron injection layer 407, the insulating layers 4022 disposed adjacent to the one side of the hole injection layer 404 are thinner, which can reduce the effect of the insulating layers 4022 on the hole transmission rate, and meanwhile the thicknesses of the insulating layers 4022 are within the range of 3 nm to 5 nm, which is not thin enough to cause the insulating layers 4022 to have no insulating effect.

In an embodiment of the present disclosure, the thicknesses of the insulating layers 4022 adjacent to the one side of the electron injection layer 407 are equal to each other, while adjacent to the one side of the hole injection layer 404, there are no insulating layers disposed between the two adjacent quantum dot layers 4021.

Wherein, there are no insulating layers 4022 disposed on the one side of the hole injection layer 404, which reduces the effect of the insulating layers 4022 on the hole transmission rate.

Wherein, the insulating layers 4022 having a same film thickness are disposed on the one side of the electron injection layer 407, which has easier processing, whereby the quantum dot layers 4021 having open circuits which are caused by the thicker insulating layers 4022 will not easily occur, and the quantum dot layers 4021 having no insulating effect which are caused by the thinner insulating layers 4022 will not easily occur, either.

Figure 4:
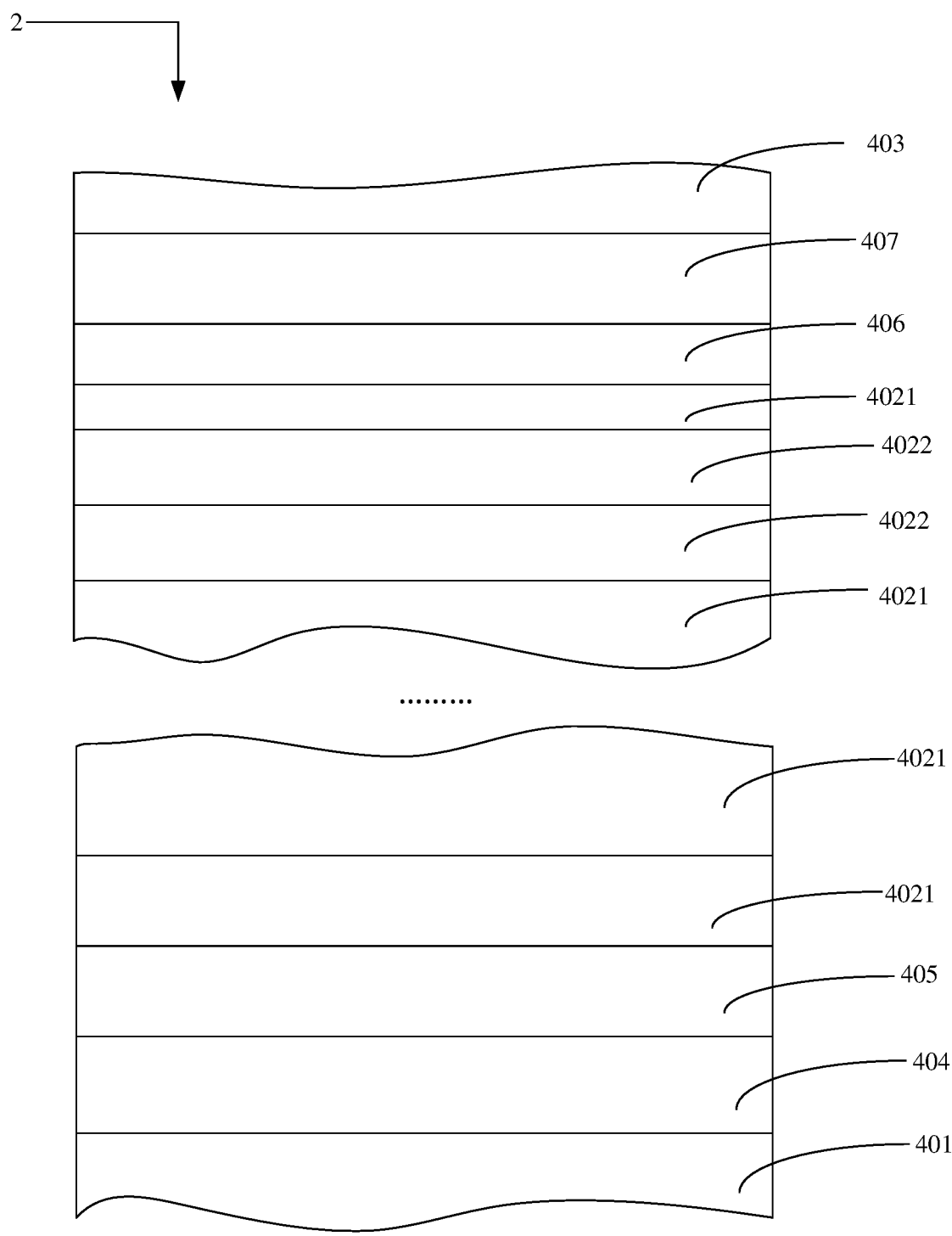
FIG. 4 is a third schematic cross-sectional diagram of a light-emitting functional layer of a QLED light-emitting device according to an embodiment of the present disclosure.

In an embodiment of the present disclosure, as shown in FIG. 4, adjacent to the one side of the electron injection layer 407, at least two of the insulating layers 4022 are disposed between two adjacent quantum dot layers 4021.

Wherein, adjacent to the one side of the electron injection layer 407, the plurality of insulating layers 4022 may be disposed between the two adjacent quantum dot layers 4021 to block more electrons.

Wherein, two of the insulating layers 4022 may be disposed between the two adjacent quantum dot layers 4021.

Wherein, three of the insulating layers 4022 may be disposed between the two adjacent quantum dot layers 4021.

An embodiment of the present disclosure further provides a QLED display panel, which includes the QLED light-emitting device, as shown in FIGS. 1 and 2. The QLED light-emitting device 2 includes the substrate 10, the array layer 20, the pixel definition layer 30, the light-emitting functional layer 40, and the encapsulation layer 50. The light-emitting functional layer 40 is disposed on the pixel definition layer 30 and includes the electron injection layer 407, the electron transport layer 406, the light-emitting layer 402, the hole transport layer 405, and the hole injection layer 404. Wherein, the light-emitting layer comprises the plurality of quantum dot layers 4021 disposed in a stack, and adjacent to one side of the electron injection layer 407, the insulating layer 4022 is disposed among the quantum dot layers 4021.

In an embodiment of the present disclosure, in the QLED display panel, as shown in FIG. 3, in the light-emitting layer, insulating layers are disposed between every two adjacent quantum dot layers.

Wherein, one of the insulating layers 4022 may be disposed between every two adjacent quantum dot layers.

Wherein, two of the insulating layers 4022 may be disposed between every two adjacent quantum dot layers.

Wherein, the thicknesses of the insulating layers 4022 may be the same or may also be different.

Wherein, the insulating layers 4022 may be disposed by coating an entire layer, or the plurality of insulating layers 4022 formed by patterning may be disposed between adjacent quantum dot layers 4021 in an array.

In the embodiment, the insulating layers 4022 are disposed between all the adjacent quantum dot layers, which can block electron transmission and meanwhile optimize membrane quality of the quantum dot layers 4021 adjacent to the insulating layers 4022.

Wherein, a preparation material of the insulating layers 4022 may be a polymethyl methacrylate material. Films made of the polymethyl methacrylate material have smooth surfaces, so the membrane quality of the quantum dot layers 4021 can be improved by fabricating the films on the quantum dot layers 4021.

In an embodiment of the present disclosure, in the QLED display panel, as shown in FIG. 3, the thicknesses of the insulating layers 4022 adjacent to the one side of the electron injection layer 407 are greater than the thicknesses of the insulating layers 4022 adjacent to the one side of the hole injection layer 404.

Wherein, through thickening the insulating layers 4022 on one side of the electron transport layer 406, the thicknesses thereof are greater than the thicknesses of the insulating layers 4022 on one side of the hole transport layer 405, and the thicker insulating layers 4022 can block more electrons, thereby overall reducing the electron transmission rate.

In the embodiment, through thickening the insulating layers 4022 adjacent to one side of the electron transport layer 406 and disposing one of the insulating layers 4022 between every two adjacent quantum dot layers 4021, surfaces of the insulating layers 4022 are flat, thereby improving the membrane quality of the quantum dot layers 4021.

In an embodiment of the present disclosure, in the QLED display panel, from one side adjacent to the electron injection layer 407 to one side adjacent to the hole injection layer 404, the thicknesses of the insulating layers 4022 are reduced in sequence.

Wherein, the thicknesses are reduced in sequence, and the thicknesses of the plurality of adjacent insulating layers 4022 are reduced in an arithmetic sequence.

Wherein, the thicknesses are reduced in sequence, and the thicknesses of the plurality of adjacent insulating layers 4022 are reduced in a geometric sequence.

In an embodiment of the present disclosure, in the QLED display panel, a preparation material of the insulating layers 4022 is the polymethyl methacrylate material.

Wherein, since the conduction band of the polymethyl methacrylate material has a higher energy level than the quantum dot layers 4021 and the polymethyl methacrylate material has good transparency, acetone can be used for solution processing, and acetone will not destroy the quantum dot layers 4021.

Wherein, the thicknesses of the quantum dot layers 4021 range from 30 nm to 100 nm.

Specifically, the combination and the number of the insulating layers 4022 and the quantum dot layers 4021 are determined by the design of the QLED light-emitting device 2 structure. The greater the combination and the number of the insulating layers 4022 and the quantum dot layers 4021 are, the more significantly the electron transmission rate is weakened. In general, the preferred combination is three quantum dot layers 4021 and two insulating layers 4022 with the polymethyl methacrylate material, which can better block electron transmission, thereby balancing the transmission of electrons and holes.

In an embodiment of the present disclosure, in the QLED display panel, the thicknesses of the insulating layers 4022 range from 3 nm to 8 nm.

Wherein, a thickness range of the polymethyl methacrylate material being 3 nm to 8 nm is necessary. A film-forming thickness of the polymethyl methacrylate material greater than 8 nm may result in the quantum dot layers 4021 having open circuits, while a film-forming thickness of the polymethyl methacrylate material less than 3 nm may not have any insulating effect.

In an embodiment of the present disclosure, in the QLED display panel, the thicknesses of the insulating layers 4022 adjacent to the one side of the electron injection layer 407 range from 6 nm to 8 nm.

In the embodiment, compared to the insulating layers 4022 adjacent to the one side of the hole injection layer 404, the insulating layers 4022 disposed adjacent to the one side of the electron injection layer 407 are thicker, which can effectively reduce the electron transmission rate, and meanwhile the thicknesses of the insulating layers 4022 are within the range of 6 nm to 8 nm, which will not result in the quantum dot layers 4021 having open circuits.

In an embodiment of the present disclosure, in the QLED display panel, the thicknesses of the insulating layers 4022 adjacent to the one side of the hole injection layer 404 range from 3 nm to 5 nm.

In the embodiment, compared to the insulating layers 4022 adjacent to the one side of the electron injection layer 407, the insulating layers 4022 disposed adjacent to the one side of the hole injection layer 404 are thinner, which can reduce the effect of the insulating layers 4022 on the hole transmission rate, and meanwhile the thicknesses of the insulating layers 4022 are within the range of 3 nm to 5 nm, which is not thin enough to cause the insulating layers 4022 to have no insulating effect.

In an embodiment of the present disclosure, in the QLED display panel, adjacent to the one side of the electron injection layer 407, the thicknesses of the insulating layers 4022 are equal to each other, and adjacent to the one side of the hole injection layer 404, there are no insulating layers disposed between two adjacent quantum dot layers 4021.

Wherein, there are no insulating layers 4022 disposed on the one side of the hole injection layer 404, which reduces the effect of the insulating layers 4022 on the hole transmission rate.

Wherein, the insulating layers 4022 having the same film thickness are disposed on the one side of the electron injection layer 407, which has easier processing, whereby the quantum dot layers 4021 having open circuits which are caused by the thicker insulating layers 4022 will not easily occur, and the quantum dot layers 4021 having no insulating effect which are caused by the thinner insulating layers 4022 will not easily occur, either.

In an embodiment of the present disclosure, in the QLED display panel, as shown in FIG. 4, adjacent to the one side of the electron injection layer 407, at least two of the insulating layers 4022 are disposed between two adjacent quantum dot layers 4021.

Wherein, adjacent to the one side of the electron injection layer 407, the plurality of insulating layers 4022 may be disposed between the two adjacent quantum dot layers 4021 to block more electrons.

Wherein, two of the insulating layers 4022 may be disposed between the two adjacent quantum dot layers 4021.

Wherein, three of the insulating layers 4022 may be disposed between the two adjacent quantum dot layers 4021.

The QLED light-emitting device 2 provided by the embodiments of the present disclosure includes a substrate, an array layer, a pixel definition layer, a light-emitting functional layer, and an encapsulation layer. The light-emitting functional layer includes an electron injection layer, an electron transport layer, a light-emitting layer, a hole transport layer, and a hole injection layer. The light-emitting layer includes a plurality of quantum dot layers disposed in a stack, and insulating layers are disposed among the quantum dot layers adjacent to one side of the electron injection layer. Wherein, through disposing the insulating layers on one side of the quantum dot layers adjacent to the electron injection layer, electron transmission can be blocked, which reduces the electron transmission rate, and membrane quality of the quantum dot layers can be improved at same time, thereby balancing the electron transmission rate and a hole transmission rate, improving luminous efficiency of QLEDs, and improving the technical problem of unbalanced transmission of electrons and holes existing in current QLED light-emitting devices.

The QLED light-emitting device and the QLED display panel provided by the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A quantum dot light-emitting diode (QLED) light-emitting device, comprising a first electrode layer, an electron injection layer, an electron transport layer, a light-emitting layer, a hole transport layer, a hole injection layer, and a second electrode layer;
wherein the light-emitting layer comprises a plurality of quantum dot layers disposed in a stack, and an insulating layer is disposed among the quantum dot layers adjacent to one side of the electron injection layer;
wherein insulating layers are disposed between every two adjacent quantum dot layers within the light-emitting layer, and thicknesses of the insulating layers adjacent to the one side of the electron injection layer are greater than thicknesses of the insulating layers adjacent to one side of the hole injection layer.

2. The QLED light-emitting device according to claim 1, wherein from one side adjacent to the electron injection layer to one side adjacent to the hole injection layer, the thicknesses of the insulating layers are reduced in sequence.

3. The QLED light-emitting device according to claim 1, wherein a preparation material of the insulating layers is a polymethyl methacrylate material.

4. The QLED light-emitting device according to claim 1, wherein the thicknesses of the insulating layers range from 3 nm to 8 nm.

5. The QLED light-emitting device according to claim 4, wherein the thicknesses of the insulating layers adjacent to the one side of the electron injection layer range from 6 nm to 8 nm.

6. The QLED light-emitting device according to claim 4, wherein the thicknesses of the insulating layers adjacent to one side of the hole injection layer range from 3 nm to 5 nm.

7. The QLED light-emitting device according to claim 1, wherein the insulating layers are disposed among adjacent quantum dot layers by coating an entire layer of the quantum dot layers.

8. The QLED light-emitting device according to claim 1, wherein a plurality of patterned arrays of the insulating layers formed by patterning are disposed between the adjacent quantum dot layers.

9. The QLED light-emitting device according to claim 1, wherein the thicknesses of the insulating layers are reduced in an arithmetic sequence.

10. The QLED light-emitting device according to claim 1, wherein the thicknesses of the insulating layers are reduced in a geometric sequence.

11. The QLED light-emitting device according to claim 1, wherein adjacent to the one side of the electron injection layer, thicknesses of the at least two insulating layers are equal to each other, and adjacent to one side of the hole injection layer, there are no insulating layers disposed between two adjacent quantum dot layers.

12. A quantum dot light-emitting diode (QLED) display panel, comprising a substrate, an array layer, a pixel definition layer, a QLED light-emitting device, and an encapsulation layer;

wherein the QLED light-emitting device comprises a first electrode layer, an electron injection layer, an electron transport layer, a light-emitting layer, a hole transport layer, a hole injection layer, and a second electrode layer; and the light-emitting layer comprises a plurality of quantum dot layers disposed in a stack, and an insulating layer is disposed among the quantum dot layers adjacent to one side of the electron injection layer; and wherein insulating layers are disposed between every two adjacent quantum dot layers within the light-emitting layer, and thicknesses of the insulating layers adjacent to the one side of the electron injection layer are greater than thicknesses of the insulating layers adjacent to one side of the hole injection layer.

13. The QLED display panel according to claim 12, wherein a preparation material of the insulating layers is a polymethyl methacrylate material.

14. The QLED display panel according to claim 12, wherein the thicknesses of the insulating layers adjacent to the one side of the electron injection layer range from 6 nm to 8 nm, and the thicknesses of the insulating layers adjacent to one side of the hole injection layer range from 3 nm to 5 nm.

15. The QLED display panel according to claim 12, wherein from one side adjacent to the electron injection layer to one side adjacent to the hole injection layer, the thicknesses of the insulating layers are reduced in sequence.

16. A quantum dot light-emitting diode (QLED) light-emitting device, comprising a first electrode layer, an electron injection layer, an electron transport layer, a light-emitting layer, a hole transport layer, a hole injection layer, and a second electrode layer;

wherein the light-emitting layer comprises a plurality of quantum dot layers disposed in a stack, and at least two insulating layers are disposed between two adjacent quantum dot layers adjacent to one side of the electron injection layer.

* * * * *